(12) United States Patent
Kim et al.

(10) Patent No.: US 12,243,355 B2
(45) Date of Patent: Mar. 4, 2025

(54) SYSTEM AND METHOD OF CALCULATING DISTANCE TO EMPTY OF VEHICLE

(71) Applicants: Hyundai Motor Company, Seoul (KR); Kia Corporation, Seoul (KR)

(72) Inventors: Do Hee Kim, Yongin-Si (KR); Jeong Soo Eo, Hwaseong-Si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 232 days.

(21) Appl. No.: 17/983,168

(22) Filed: Nov. 8, 2022

(65) Prior Publication Data
US 2023/0377377 A1 Nov. 23, 2023

(30) Foreign Application Priority Data
May 19, 2022 (KR) .................. 10-2022-0061344

(51) Int. Cl.
| | | |
|---|---|---|
| *B60L 58/12* | (2019.01) | |
| *G01R 31/367* | (2019.01) | |
| *G01R 31/374* | (2019.01) | |
| *G01R 31/382* | (2019.01) | |
| *G07C 5/00* | (2006.01) | |
| *G07C 5/02* | (2006.01) | |

(52) U.S. Cl.
CPC .............. *G07C 5/004* (2013.01); *B60L 58/12* (2019.02); *G01R 31/367* (2019.01); *G01R 31/374* (2019.01); *G01R 31/382* (2019.01); *G07C 5/02* (2013.01)

(58) Field of Classification Search
CPC ........ G07C 5/004; G07C 5/02; G01R 31/374; G01R 31/382; G01R 31/367; B60L 58/12
See application file for complete search history.

(56) References Cited

U.S. PATENT DOCUMENTS

| 9,037,327 B2 | 5/2015 | Kim |
| 9,574,889 B2 | 2/2017 | Kim et al. |
| 2007/0111852 A1* | 5/2007 | Yatabe .................. B60K 6/448 477/107 |

(Continued)

FOREIGN PATENT DOCUMENTS

| JP | 1994-189402 A | 7/1994 |
| JP | 2020-029178 A | 2/2020 |

(Continued)

*Primary Examiner* — Dalena Tran
(74) *Attorney, Agent, or Firm* — Morgan, Lewis & Bockius LLP

(57) ABSTRACT

In a method and system for determining a DTE of a vehicle, real-time transportation situation information from a current position of the vehicle to a destination is transmitted to a vehicle. The transmitted transportation situation information and obtaining vehicle forward driving situation information to the destination are received. Predicted battery consumption energy consumed for traveling from the current position to the destination using a battery usage prediction model to which the obtained vehicle forward driving situation information and current vehicle state information obtained from the vehicle are input are predicted and determined. A DTE at the destination as a predicted value at the current position is determined using the determined predicted battery consumption energy to the destination.

20 Claims, 4 Drawing Sheets

(56) References Cited

U.S. PATENT DOCUMENTS

| | | | |
|---|---|---|---|
| 2012/0176231 A1* | 7/2012 | Skaff | B60R 16/0236 |
| | | | 340/439 |
| 2012/0179319 A1* | 7/2012 | Gilman | B60W 50/0097 |
| | | | 340/455 |
| 2014/0025364 A1 | 1/2014 | Ballentin et al. | |
| 2015/0367856 A1* | 12/2015 | Meyer | G07C 5/08 |
| | | | 701/123 |
| 2017/0038222 A1* | 2/2017 | Meyer | B60L 58/12 |
| 2020/0292620 A1 | 9/2020 | Takahashi et al. | |

FOREIGN PATENT DOCUMENTS

| | | |
|---|---|---|
| KR | 2014-083555 A | 7/2014 |
| KR | 2018-0057458 A | 5/2018 |
| KR | 2021-062205 A | 5/2021 |

\* cited by examiner

SYSTEM AND METHOD OF CALCULATING DISTANCE TO EMPTY OF VEHICLE

CROSS REFERENCE TO RELATED APPLICATION

The present application claims priority to Korean Patent Application No. 10-2022-0061344, filed May 19, 2022, the entire contents of which is incorporated herein for all purposes by this reference.

BACKGROUND OF THE PRESENT DISCLOSURE

Field of the Present Disclosure

The present disclosure relates to a system and method of determining a distance to empty (DTE) of a vehicle. More particularly, the present disclosure relates to a system and method of determining a DTE of a vehicle, the system and method being able to reduce uncertainty in predicting future driving conditions for a remaining travel route and continuously and effectively reflect information regarding changing forward driving situations on the remaining travel route using the prediction model, improving the accuracy of DTE prediction.

Description of Related Art

Generally, a vehicle is provided with a function of predicting a DTE and notifying a driver of the predicted DTE. For example, in an internal combustion engine (ICE) vehicle, a DTE is predicted based on a fuel level in a fuel tank and notified to a driver through a cluster or the like.

Likewise, in an electric vehicle propelled by driving a motor using electric power from a battery, a DTE is predicted based on the current residual energy (or residual capacity) of the battery and displayed on a cluster or the like.

Because a driver in an electric vehicle is more sensitive to the DTE, it is important to accurately notify the driver of the DTE based on residual energy of the battery in real time during traveling of the vehicle.

Conventionally, the DTE of a vehicle has been predicted using the relationship between the residual energy of the battery and energy efficiency (or fuel efficiency). For example, a method of determining energy efficiency configured as fuel efficiency using information accumulated from the past and then determining a DTE by multiplying the determined energy efficiency and current residual energy of the battery is disclosed.

Furthermore, conventionally, a method of determining a final DTE by combining weighted factors applied to a past DTE and a DTE on a current route and then adjusting the determined DTE according to the occurrence of an event is disclosed. That is, the disclosed method determines and adjusts the DTE using information accumulated from the past and information regarding forward events.

Although the DTE using the energy efficiency of the past is determined to overcome the uncertainty of predicted future driving information, it is only applicable on the assumption that the energy consumption tendency of the past will remain in the future. However, when future transportation situations exhibit a different aspect from the past driving information, there may be a significant error in the energy efficiency based on the past information.

Furthermore, conventionally, the DTE is updated whenever an energy consuming event occurs. However, this may cause, as a result, the effect of the corresponding event on a remaining travel route to be overrepresented or underrepresented.

The information included in this Background of the present disclosure is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing a system and method of determining a distance to empty (DTE) of a vehicle, the system and method being able to reduce uncertainty in predicting future driving conditions for a remaining travel route and continuously and effectively reflect information regarding changing forward driving situations on the remaining travel route using the prediction model, improving the accuracy of DTE prediction.

To achieve at least one of the above objectives, according to an exemplary embodiment of the present disclosure, there is provided a method of determining a DTE of a vehicle. The method may include: in a state in which a travel route to a destination is set, transmitting real-time transportation situation information from a current position of a vehicle to the destination to the vehicle by a vehicle external system; receiving the transmitted transportation situation information and obtaining vehicle forward driving situation information to the destination, on which a real-time transportation situation is reflected, by a navigation terminal or a controller provided in the vehicle; predicting and determining, by the controller, predicted battery consumption energy consumed for traveling from the current position to the destination using a battery usage prediction model to which the obtained vehicle forward driving situation information and current vehicle state information obtained from the vehicle are input; and determining, by the controller, a DTE at the destination as a predicted value at the current position using the determined predicted battery consumption energy to the destination.

According to another exemplary embodiment of the present disclosure, there is provided a system for determining a DTE of a vehicle. The system may include: a vehicle external system providing real-time transportation situation information from a current position of the vehicle to a destination on a travel route to the destination; a navigation terminal provided in a vehicle to transmit destination information received from a driver to the vehicle external system and receive information regarding the travel route to the destination and a map and the real-time transportation situation information from the vehicle external system; and a controller configured for predicting and determining predicted battery consumption energy consumed for traveling from the current position to the destination using a battery usage prediction model to which vehicle forward driving situation information on which a real-time transportation situation is reflected and current vehicle state information obtained from the vehicle are input, and determining a DTE at the destination as a predicted value at the current position using the determined predicted battery consumption energy to the destination. The vehicle forward driving situation information to the destination, on which the real-time transportation situation is reflected, may be obtained from the information regarding the travel route to the destination and the map and the received transportation situation information by the navigation terminal provided in the vehicle or the controller.

According to an exemplary embodiment of the present disclosure, the system and method of determining a DTE of a vehicle may reduce uncertainty in predicting future driving conditions for a remaining travel route and continuously and effectively reflect information regarding changing forward driving situations on the remaining travel route using the prediction model, improving the accuracy of DTE prediction.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

Figure 1:
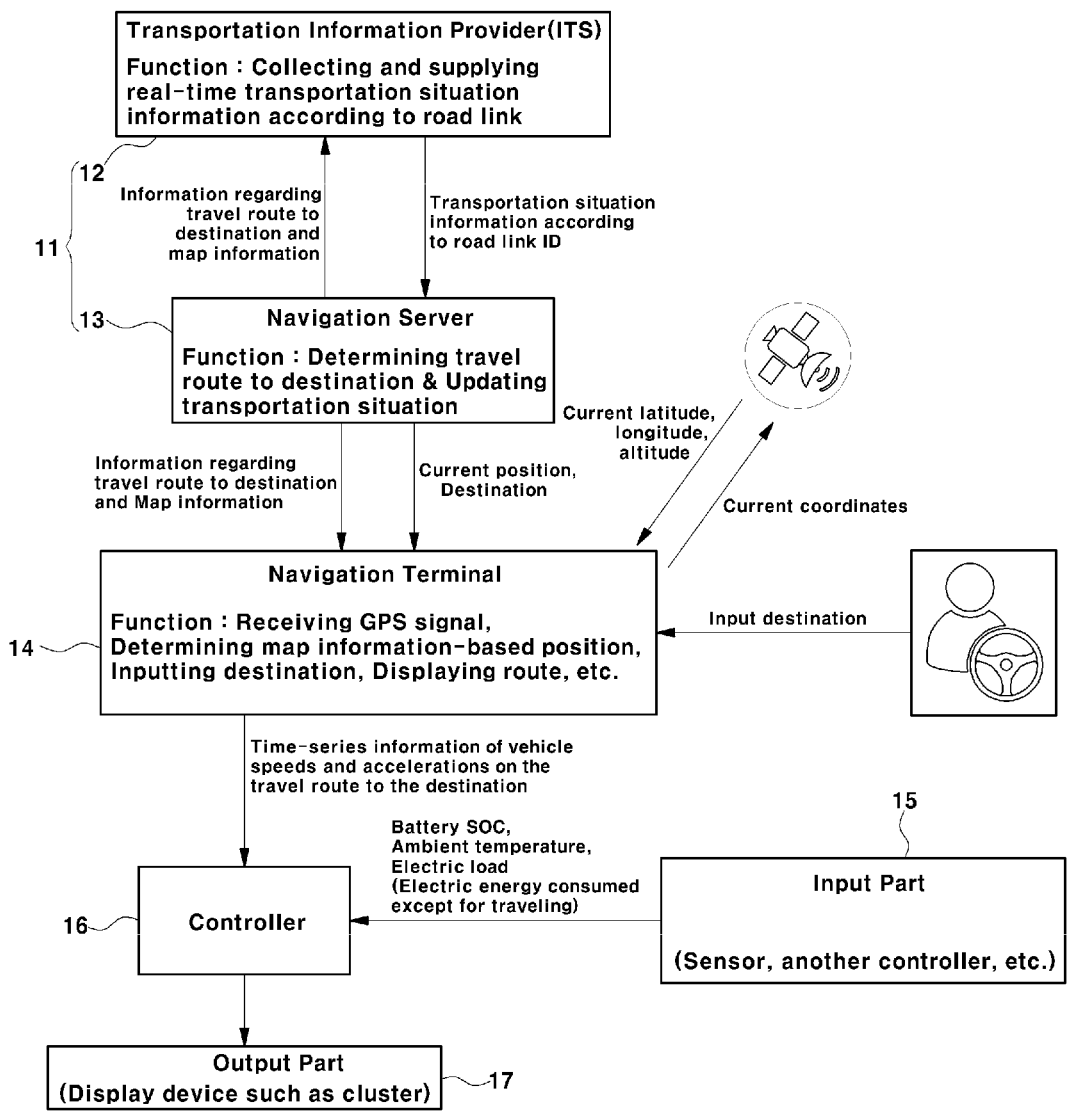
FIG. 1 is a block diagram illustrating a configuration of a system for determining a DTE according to an exemplary embodiment of the present disclosure.

It may be understood that the appended drawings are not necessarily to scale, presenting a somewhat simplified representation of various features illustrative of the basic principles of the present disclosure. The specific design features of the present disclosure as included herein, including, for example, specific dimensions, orientations, locations, and shapes will be determined in part by the particularly intended application and use environment.

In the figures, reference numbers refer to the same or equivalent parts of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

Specific structural and functional descriptions of embodiments of the present disclosure included herein are only for illustrative purposes of the exemplary embodiments of the present disclosure. The present disclosure may be embodied in various forms without departing from the spirit and significant characteristics of the present disclosure. Furthermore, the present disclosure is directed to cover not only the exemplary embodiments of the present disclosure, but also various alternatives, modifications, equivalents, and other embodiments which may be included within the spirit and scope of the present disclosure.

It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

It will be understood that when an element is referred to as being "coupled", "connected", or "linked" to another element, it may be directly coupled or connected to the other element or intervening elements may be present therebetween. In contrast, it should be understood that when an element is referred to as being "directly coupled", "directly connected", or "directly connected" to another element, there are no intervening elements present. Other expressions that explain the relationship between elements, such as "between", "directly between", "adjacent to", or "directly adjacent to" should be construed in the same way.

Throughout the specification, the same reference numerals will refer to the same or like parts. The terminologies used herein are for describing various exemplary embodiments only and are not intended to limit the present disclosure. As used herein, singular forms are intended to include plural forms as well, unless the context clearly indicates otherwise. It will be further understood that the terms "comprise", "include", "have", etc. when used in the present specification, specify the presence of stated features, integers, steps, operations, elements, components, and/or combinations thereof but do not preclude the presence or addition of one or more other features, integers, steps, operations, elements, components, and/or combinations thereof.

The present disclosure is directed to providing a system and method of determining a distance to empty (DTE) of a vehicle, the system and method being able to reduce uncertainty in predicting future driving conditions for a remaining travel route and further increase the accuracy of DTE prediction.

To reduce the problem of the related art, i.e., the uncertainty in predicting future driving conditions for the remaining travel route, a model able to predict a battery usage (or battery consumption energy) to a destination on a travel route is necessary.

In this regard, the present disclosure constructs a prediction model able to accurately predict the battery usage (or battery consumption energy) and continuously and effectively reflects information regarding changing forward driving situations on the remaining travel route using the prediction model to improve the accuracy of DTE prediction.

Furthermore, the present disclosure forms information regarding the external environment of a vehicle (hereinafter, referred to as "vehicle external environment information") by converting information regarding the remaining travel route and a corresponding map and real-time transportation situation information to time-series information of speeds and accelerations. Here, the vehicle external environment information may be, for example, information regarding forward driving situations (hereinafter, referred to as "forward driving situation information") on which real-time transportation situations are reflected. The present disclosure also forms the residual capacity or the state of charge (SOC) value of the battery, an electric load, and the ambient temperature of the vehicle into vehicle state information. Then, the present disclosure predicts the battery usage (or battery consumption energy) corresponding to the remaining travel route using a machine learning model as a prediction model including the vehicle external environment information and the vehicle state information as inputs.

Figure 2:
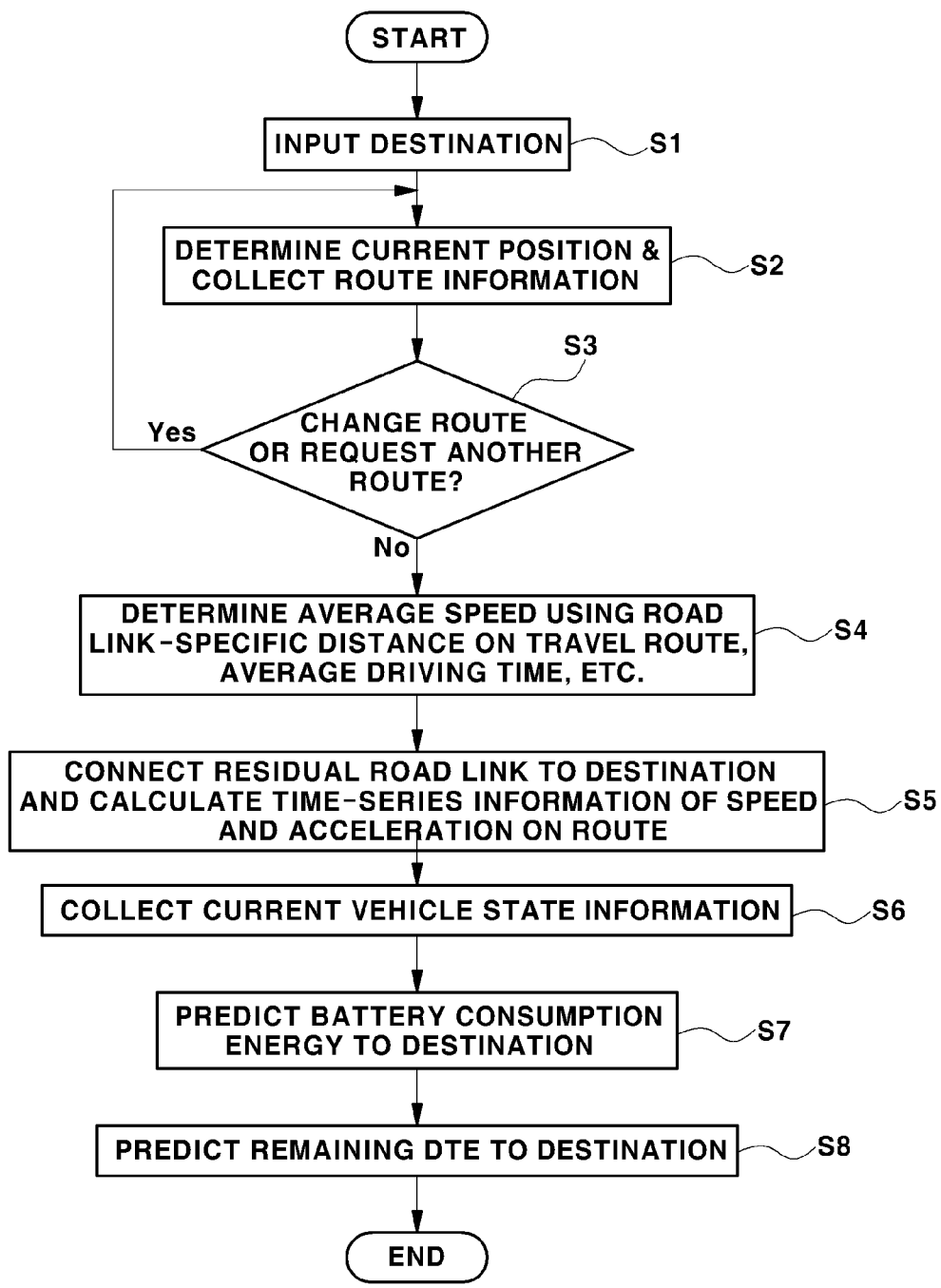
FIG. 2 is a flowchart illustrating a process of determining a DTE according to an exemplary embodiment of the present disclosure.

FIG. 1 is a block diagram illustrating a configuration of a system for determining a DTE according to an exemplary embodiment of the present disclosure, and FIG. 2 is a flowchart illustrating a process of determining a DTE according to an exemplary embodiment of the present disclosure.

In the following description, a term "SOC" refers to the state of charge of the battery. The SOC is information indicating the residual capacity (or residual energy) of the battery. Typically, the SOC is one of pieces of battery state information provided in real time by a battery management system (BMS). In the block diagram of FIG. 1, an input portion 15 may include the MBS providing battery SOC information.

As illustrated in FIG. 1 and FIG. 2, the system for determining a DTE may include a vehicle external system 11, a navigation terminal 14, the input portion 15, a controller 16, and an output portion 17.

First, the vehicle external system 11 includes a transportation information provider 12 providing real-time transportation situation information. The transportation information provider 12 may be an intelligent transportation system (ITS) outside the vehicle. The ITS collects and provides real-time transportation situation information according to the road link.

Furthermore, the vehicle external system 11 further includes a navigation server 13. The navigation server 13 generates a travel route to the destination, updates transportation situation information on the travel route to the destination, and provides the updated transportation situation information to the vehicle.

The navigation server 13 receives current position and destination information of the vehicle from the navigation terminal 14, and retrieves and generates the travel route to the destination based on the received current position and destination information of the vehicle.

Furthermore, the navigation server 13 transmits information regarding the generated travel route to the destination and a corresponding map, together with the real-time transportation situation information received from the transportation information provider 12, to the navigation terminal 14 of the vehicle.

Here, the navigation server 13 may generate a plurality of travel routes by retrieving the travel route to the destination and transmit the plurality of generated travel routes to the navigation terminal 14 of the vehicle.

Thus, when the navigation terminal 14 receives the plurality of travel routes and displays the plurality of travel routes on a display device and a driver selects and finally determines one of the plurality of displayed travel routes, the navigation terminal 14 may transmit the finally-determined travel route to the navigation server 13.

Referring to FIG. 2, step S1 of inputting a destination by a driver, step S2 of determining a current position and collecting route information, and step S3 of changing a route or requesting another route are illustrated. A process of inputting the destination and setting the travel route to the destination in a vehicle may be modified variously.

The navigation server 13 may transmit information regarding the finally-determined travel route to the destination and the map to the transportation information provider 12, collect the real-time transportation situation information according to the road link based on the received information regarding the travel route to the destination and the map, and transmit real-time transportation situation information according to road link ID to the navigation server 13.

Furthermore, the navigation server 13 may transmit the real-time transportation situation information according to the road link ID to the navigation terminal 14 of the vehicle by receiving the real-time transportation situation information according to the road link ID from the transportation information provider 12.

The navigation terminal 14 includes a global positioning system (GPS) receiver, and receives a GPS signal (including latitude, longitude, and altitude information of the position of the vehicle) regarding the position of the vehicle from a GPS satellite using the GPS receiver. Here, the navigation terminal 14 may determine and recognize the current position of the vehicle based on the received GPS signal and the map information received from the navigation server 13.

Furthermore, the navigation terminal 14 is provided so that the driver inputs the destination. In a state in which the travel route is set in response to the destination being input by the driver, the navigation terminal 14 receives the information regarding the travel route to the destination and the map, the real-time transportation situation information, and the like, and displays the received information on the display device. Here, the real-time transportation situation information may include road information according to the road link on the travel route and average driving time information of the vehicle.

In the present disclosure, the transportation information provider 12 provides the transportation situation information on the travel route by updating the transportation situation information, and the navigation server 13 receives the updated real-time transportation situation information and transmits the real-time transportation situation information to the navigation terminal 14 of the vehicle.

Subsequently, the navigation terminal 14 of the vehicle determines and obtains time-series information of vehicle speeds and accelerations on the travel route to the destination from the current position using the information regarding the travel route to the destination and the map and the real-time transportation situation information received from the navigation server 13, and then transfers the determined time-series information of vehicle speeds and accelerations to the controller 16 of the vehicle.

Here, the navigation terminal 14 may determine average vehicle speeds according to the road link using distances and average driving times according to the road link on the remaining travel route, i.e., the real-time transportation situation information (step S4 in FIG. 2), and then determine and obtain the time-series information of vehicle speeds and accelerations on the remaining travel route by connecting remaining road links from the current position to the destination (step S5 in FIG. 2).

According to another exemplary embodiment of the present disclosure, when the navigation terminal 14 of the vehicle transfers the information regarding the route to the destination and the map received from the navigation server 13 and the real-time transportation situation information to the controller 16 of the vehicle, the controller 16 may determine and obtain time-series information of vehicle speeds and accelerations on the travel route to the destination using the information regarding the route to the destination and the map and the real-time transportation situation information received from the navigation terminal 14.

The transportation situation information is continuously updated in real time through the transportation information provider 12 as described above. In the present disclosure, the time-series information of vehicle speeds and accelerations on the travel route to the destination determined based on the information regarding real-time transportation situations to the destination as described above are the forward driving situations information and the external environment information of the vehicle necessary for predicting the battery usage from the current position to the destination on the travel route.

Furthermore, the controller 16 receives information necessary for predicting the battery usage to the destination on the travel route from a sensor or a detection element in the vehicle as the input portion 15 or another controller. That is, the controller 16 receives vehicle state information, i.e., another input of a battery usage prediction model (step S6 in FIG. 2).

The controller 16 may receive battery SOC information, i.e., real-time residual energy information, from another controller, e.g., a BMS, and receive an electric load, which is being consumed currently, from a third related controller. Furthermore, the controller 16 may obtain the real-time ambient temperature information detected by a sensor. The electric load refers to consumption energy except for electricity consumed by a driving motor or the like to drive the vehicle.

Furthermore, the controller 16 predicts the battery usage (or battery consumption energy) for traveling from the current position to the destination on the travel route based on the input information, by use of the battery usage prediction model (step S7 in FIG. 2).

Here, the controller 16 may determine SOC-based predicted consumption energy to be used from the current position to the destination using predicted battery consumption energy, i.e., the predicted battery usage, and determine a fuel efficiency (or energy efficiency) to the destination using the predicted battery consumption energy to the destination and the remaining travel distance from the current position to the destination on the travel route.

Hereinafter, the remaining travel distance from the current position to the destination on the travel route will be briefly referred to as the "remaining travel distance to the destination", and the fuel efficiency to the destination, determined and predicted from the predicted battery consumption energy to the destination and the remaining travel distance to the destination, will be referred to as the "predicted fuel efficiency". Here, the predicted fuel efficiency (km/kWh) is a value obtained by dividing the remaining travel distance (km) to the destination with the predicted battery consumption energy (kWh) to the destination.

The fuel efficiency refers to energy consumption (kWh) per unit distance (km), and the unit of the fuel efficiency may be "km/kWh". Furthermore, the fuel efficiency corresponds to the fuel efficiency (or mileage) of an ICE vehicle. The fuel efficiency refers to an energy consumption rate or energy efficiency as in the fuel efficiency of an ICE vehicle. In the following description, the fuel efficiency may be substituted with another term, such as "energy consumption rate" or "energy efficiency".

In the controller 16, the predicted battery consumption energy to the destination indicating a predicted battery usage value is determined from the vehicle forward driving situations information (or vehicle external environment information) and the vehicle state information by the battery usage prediction model. Furthermore, in the controller 16, the SOC-based predicted consumption energy to be used to the destination is determined from the predicted battery consumption energy to the destination.

At the same time, when the predicted fuel efficiency (or predicted energy efficiency) to the destination is determined from the remaining travel distance to the destination and the predicted battery consumption energy, a DTE to be reduced from the current position to the destination is determined using the SOC-based predicted consumption energy to be used to the destination and the predicted fuel efficiency (or predicted energy efficiency value) to the destination.

Consequently, while the vehicle is traveling from the current position to the destination, the controller 16 may determine a DTE at the destination as a value obtained by subtracting a DTE which has been reduced up to the present in response to the traveling of the vehicle and the DTE to be reduced from the current position to the destination from the initial SOC-based maximum DTE (step S8 in FIG. 2).

The DTE at the destination (hereinafter, referred to as "destination DTE") is a DTE value when the vehicle arrives at the destination, predicted at the current position. The destination DTE is the DTE of the vehicle finally obtained in the present disclosure. While the vehicle is traveling from the current position to the destination, the controller 16 may continuously obtain the destination DTE in the same manner using information regarding the predicted fuel efficiency and the destination DTE which are updated in real time.

The output portion 17 in the configuration illustrated in FIG. 1 is connected to the controller 16. The output portion 17 may include a display device configured to operate in response to a control signal output by the controller 16 in the vehicle and display information regarding the finally-determined destination DTE.

Furthermore, the output portion 17 may be configured to display not only the finally-determined DTE but also information necessary for the production of the DTE or additional information and the like produced during the production of the DTE.

The output portion 17 provided as a display device may include a cluster of the vehicle. Furthermore, the output portion 17 may include a display device of an audio, video, and navigation (AVN) system including the navigation terminal 14. Furthermore, the output portion 17 may include a head-up display (HUD) as the display device.

Furthermore, a communicatively-connected user terminal, such as a smartphone, may be used as the output portion 17. The driver may be provided with target information using a smartphone in which an application program is provided, in the same manner as using the display device of the vehicle.

Figure 3:
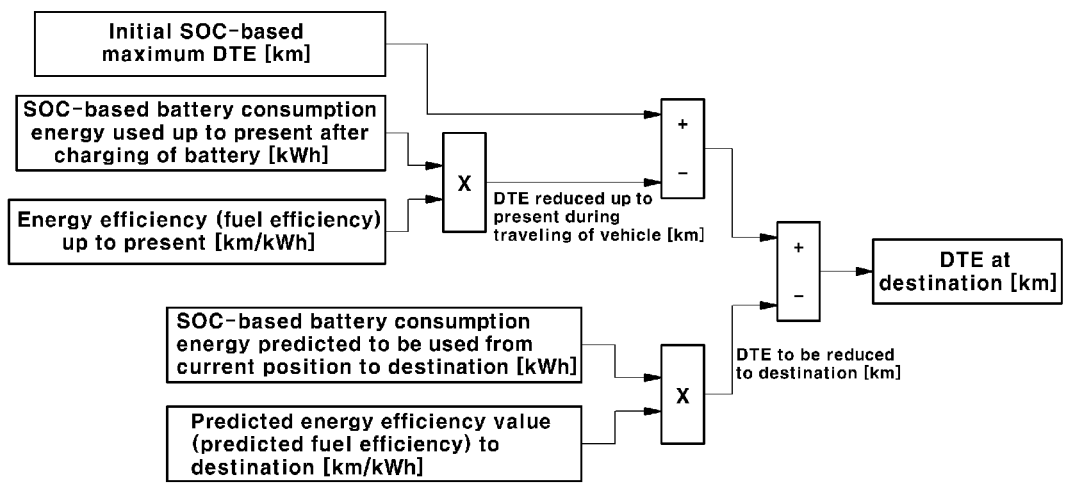
FIG. 3 is a block diagram illustrating a method of determining a DTE according to an exemplary embodiment of the present disclosure.

FIG. 3 is a block diagram illustrating a method of determining a DTE according to an exemplary embodiment of the present disclosure. The present disclosure is directed to construct and use a battery usage prediction model able to predict the battery consumption energy (or battery usage) to the destination based on big data and using the vehicle external environment information and the vehicle state information as inputs.

The big data-based battery usage prediction model may be a machine learning model. As described above, when new data is input in the same input structure using the battery usage prediction model, resultant battery consumption energy may be predicted.

In the present disclosure, after the predicted battery consumption energy, i.e., the predicted battery usage value, from the current position to the destination is determined using the battery usage prediction model, the SOC-based predicted consumption energy to be used from the current position to the destination and the predicted fuel efficiency (or predicted energy efficiency) to the destination are determined using the determined predicted battery consumption energy. Subsequently, the DTE to be reduced from the current position to the destination is determined to be a value obtained by multiplying the determined SOC-based predicted consumption energy with the predicted fuel efficiency to the destination.

Furthermore, the destination DTE is finally produced using the determined DTE to be reduced from the current position to the destination. The finally-determined destination DTE is displayed and provided to the driver.

Here, the destination DTE may be determined to be a value from which the DTE, which has been reduced (or consumed) up to the present from the initial SOC-based maximum DTE with the traveling of the vehicle, and the DTE to be reduced from the current position to the destination, determined using the battery usage prediction model, are subtracted.

The destination DTE is a predicted value of the DTE remaining when the vehicle arrives at the destination from the current position. The destination DTE is information continuously obtained using the predicted battery consumption energy obtained at the current position of the vehicle until the vehicle arrives at the destination. While the vehicle is traveling from the current position to the destination, the input value and the output value of the battery usage prediction model may vary. Thus, the destination DTE obtained during the traveling of the vehicle arriving at the destination from the current position may vary depending on the situation.

The initial SOC-based maximum DTE is the maximum DTE immediately after the battery is charged. The initial SOC-based maximum DTE may be obtained from the initial battery SOC immediately after the charging of the battery and the maximum DTE at the time of full charging when the battery of the vehicle is fully charged (i.e., 100%). That is, the initial SOC-based maximum DTE (km) may be determined to be a value obtained by multiplying the initial battery SOC (%) and the maximum DTE (km) at the time of full charging.

Furthermore, the SOC-based battery consumption energy used up to the present after the charging of the battery may be determined based on the battery SOC which has been used up to the present from the initial battery SOC, the fuel efficiency (or energy efficiency) up to this may be determined, and then the DTE which has been reduced up to this may be obtained from the SOC-based battery consumption energy used up to the present and the fuel efficiency up to the present. That is, the DTE (km) reduced up to this may be determined to be a value obtained by multiplying the SOC-based battery consumption energy (kWh) used up to the present and the fuel efficiency (km/kWh) up to the present.

Here, the SOC-based battery consumption energy (kWh) used up to this may be determined to be a value obtained by multiplying the battery SOC (%) reduced up to the present after the charging of the battery and the maximum available battery energy (kWh) at the time of full charging (i.e., 100%). The battery SOC reduced up to this is determined by subtracting the current battery SOC from the initial battery SOC, i.e., a battery SOC value immediately after the charging of the battery.

The fuel efficiency, i.e., the energy efficiency up to the present, may be obtained from a distance traveled by the vehicle up to the present and cumulatively-consumed battery energy which has accumulated up to the present. For example, the fuel efficiency (km/kWh), i.e., the energy efficiency up to the present, may be determined to be a value obtained by dividing the distance traveled by the vehicle up to the present with the cumulatively-consumed battery energy which has accumulated up to the present.

Furthermore, the DTE to be reduced from the current position to the destination may be determined using values determined by the battery usage prediction model. In the present disclosure, the battery usage prediction model may be a machine learning-based prediction model.

When the predicted battery consumption energy to the destination is determined by the battery usage prediction model, the SOC-based predicted consumption energy (kWh) to be used from the current position to the destination and the predicted fuel efficiency (km/kWh), i.e., the energy efficiency, predicted to the destination are determined using the determined predicted battery consumption energy to the destination.

Afterwards, the DTE to be reduced from the current position to the destination may be determined using the determined SOC-based predicted consumption energy and the predicted fuel efficiency (or predicted energy efficiency value). Here, the DTE to be reduced from the current position to the destination (km) may be determined as a value obtained by multiplying the determined SOC-based predicted consumption energy (kWh) and the predicted fuel efficiency (km/kWh) to the destination.

The battery usage prediction model is used to predict the battery usage (or battery consumption energy) to the destination by use of the vehicle forward driving situations information (vehicle external environment information) on the travel route and the vehicle state information as inputs. The output of the battery usage prediction model is the predicted battery consumption energy to the destination, which is used to determine the DTE to be reduced from the current position to the destination.

The predicted battery consumption energy to the destination is information used to determine a DTE to be reduced to the destination. That is, the predicted battery consumption energy to the destination is used to determine the SOC-based predicted consumption energy to be used from the current position to the destination and the predicted fuel efficiency (energy efficiency) to the destination.

Here, the SOC-based predicted consumption energy to be used to the destination may be a value obtained by multiplying the battery SOC value predicted to be reduced from the current position to the destination and the maximum available battery (kWh/100%) at the time of full charging (i.e., 100%).

The battery SOC value predicted to be reduced is a battery SOC value predicted to be reduced during travel of the vehicle from the current position to the destination, predicted using the real-time vehicle forward driving situation information (or vehicle external environment information) and the vehicle state information.

As described later, the battery SOC value predicted to be reduced may be a value obtained by subtracting the finally-predicted battery SOC at the destination from the current battery SOC. Here, the finally-predicted battery SOC at the destination may be determined to be a value obtained by dividing the predicted battery consumption energy, i.e., a predicted battery usage value, determined by the battery usage prediction model with the maximum available battery energy at the time of full charging.

Consequently, as the vehicle travels on the initial SOC-based maximum DTE, the destination DTE may be determined to be a value from which the DTE reduced up to the present and the DTE to be reduced to the destination are subtracted.

Generally, energy to be consumed in the future is predicted using the accumulated energy efficiency (or fuel efficiency) information. The present prediction was possible on the assumption that an effect of the past will continue into the future. However, when a future driving situation is different from the past information, such as the energy efficiency, the predicted value may have a significant error.

In contrast, the present disclosure may overcome the problem caused by the uncertainty in predicting future driving conditions for the remaining travel route by use of information determined by the machine learning-based battery usage prediction model, further improving the accuracy of the DTE prediction.

Figure 4:
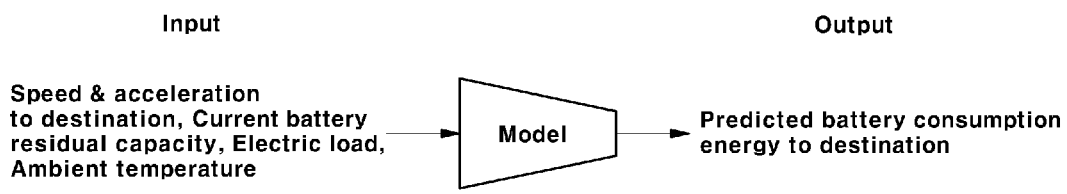
FIG. 4 and FIG. 5 are diagrams illustrating inputs and outputs of a battery usage prediction model.
Figure 5:
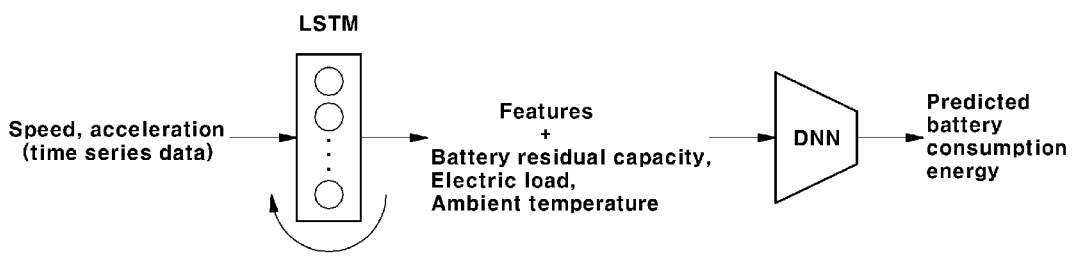

FIG. 4 and FIG. 5 are diagrams illustrating inputs and outputs of the battery usage prediction model.

The battery usage prediction model determines the predicted battery consumption energy, i.e., the predicted battery usage value, to the destination by use of the forward driving situation information, obtained by the navigation terminal 14 of the vehicle, and the vehicle state information, obtained by the input portion 15.

Here, the forward driving situation information is the vehicle external environment information determined based on the map information and the real-time transportation situation information on the remaining travel route. The forward driving situation information may include the real-time information of vehicle speeds and accelerations on the road on which the vehicle is traveling.

Furthermore, the vehicle state information is information provided by the input portion 15 of the vehicle. The vehicle state information may include the residual battery capacity, the electric load, and the ambient temperature. The residual battery capacity is real-time residual energy information. The electric load is consumption energy except for electricity necessary for driving. The ambient temperature is information regarding conditions and environment surrounding the vehicle. Here, the residual battery capacity may be battery SOC.

In the vehicle, the navigation terminal 14 determines and obtains the time-series information of vehicle speeds and accelerations on the travel route to the destination using the information regarding the travel route to the destination and the map and the real-time transportation situation information received from the navigation server 13, and transfers the determined time-series information of vehicle speeds and accelerations to the controller 16 of the vehicle.

Alternatively, the controller 16 in the vehicle may obtain the time-series information of vehicle speeds and accelerations on the travel route to the destination by receiving the information regarding the travel route to the destination and the map and the real-time transportation situation information through the navigation terminal 14.

Here, the travel route to the destination may be divided according to the road links in specific units, and distances of the corresponding road links and average driving time information may be collected. An average speed may be determined using the collected pieces of information. Afterwards, information of speeds and accelerations on the remaining route may be extracted by connecting remaining road links present on the remaining route the destination. Here, information of speeds and accelerations on the entire remaining route may be extracted.

As a result, in the controller 16, the extracted information of speeds and accelerations and information regarding the current residual battery capacity (SOC), the electric load, and the ambient temperature are input to the machine learning-based prediction model (or battery usage prediction model), and the prediction of the battery consumption energy is performed.

Referring to FIG. 4, data input to the battery usage prediction model may be understood as including the vehicle external environment information, such as vehicle speeds and accelerations, to the destination and the vehicle state information, such as the current residual battery capacity (SOC), the electric load, and the ambient temperature.

Here, the vehicle external environment information is the forward driving situation information reflecting the real-time transportation situation information on the travel route to the destination.

The vehicle speeds and accelerations of the vehicle external environment information among the input data may be time-series information indicating features continuing for a predetermined time period. Thus, the vehicle speeds and accelerations may be regarded as including time-specific array values.

Furthermore, the residual battery capacity, the electric load, and the ambient temperature of the vehicle state information among the input data may be state information indicating predetermined changes in time interval. That is, each of the residual battery capacity, the electric load, and the ambient temperature may have a predetermined time interval.

Here, the predicted battery consumption energy to the destination, i.e., the output data, of the battery usage prediction model indicates a predicted battery usage value to the destination. The predicted battery consumption energy to the destination may be battery consumption energy characterized by being accumulated for a predetermined time period.

Furthermore, in the battery usage prediction model, a recurrent neural network (RNN) configured to effectively use the previous information, more particularly, a long short-term memory (LSTM) characterized by being able to memorize previous values for a predetermined time period may be used to allow continuous feature information of the vehicle external environment information from the current position to the destination to be more understood. The predetermined time period feature is determined by the number of neurons of the LSTM.

Furthermore, according to an exemplary embodiment of the present disclosure, to predict the battery consumption energy (or battery usage), as illustrated in FIG. 5, a deep learning neural network (DNN) may be constructed. The DNN is configured to output battery consumption energy predicted for a predetermined time period using the above-determined feature information (i.e., features) and the vehicle state information (i.e., the residual battery capacity, the electric load, and the ambient temperature) as inputs.

That is, the battery usage prediction model for predicting the battery consumption energy to the destination according to an exemplary embodiment of the present disclosure may be a model including a configuration in which the LSTM and the DNN are mixed.

Referring to FIG. 5, it may be appreciated that the LSTM determines the continuous feature information (i.e., features) by use of the time-series data of vehicle speeds and accelerations as inputs, and that the DNN determines the predicted battery consumption energy by use of the determined feature information (i.e., features) and the residual battery capacity, the electric load, the ambient temperature of the vehicle state information as inputs.

As a result, when the external environment information and the vehicle state information are provided through the LSTM-DNN mixture model illustrated in FIG. 5, a model able to predict the battery consumption energy may be trained.

Furthermore, the battery consumption energy (or predicted battery consumption energy) may be predicted from the time-series data of vehicle speeds and accelerations to the destination of the vehicle external environment information (or forward driving situation information) and the residual battery capacity (or SOC), the electric load, and the ambient temperature of the vehicle state information using the trained model illustrated in FIG. 5.

Figure 6:
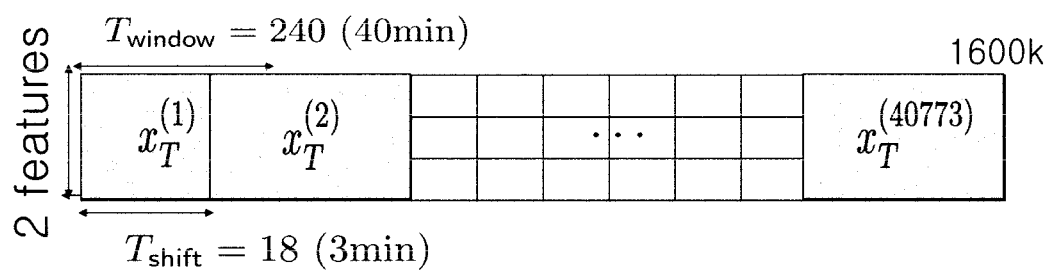
FIG. 6 is a diagram illustrating an example of using time-series information according to an exemplary embodiment of the present disclosure.

FIG. 6 is a diagram illustrating an example of using time-series information according to an exemplary embodiment of the present disclosure.

According to an exemplary embodiment of the present disclosure, in the extraction of the vehicle external environment information, i.e., data input to the battery usage prediction model, the information of speeds and accelerations obtained in real time is time-series information, which may be combined and used as values of time windows including the same and predetermined size. It is possible to extract the feature information (i.e., features) of speeds and accelerations while moving the time-series information at a predetermined time shift interval.

The information of speeds and accelerations obtained from the information regarding the remaining travel route and the map is formed as a time window having a predetermined size, because a history of changes over time is important. Features of the time-series information are stored through update at the predetermined time shift interval.

Furthermore, the real-time vehicle state information, i.e., another data input to the battery usage prediction model, may be allocated as a first value of a time window the same as the vehicle external environment information. Here, the vehicle state information may be extracted by moving the real-time vehicle state information at the same time shift interval as the vehicle external environment information.

Furthermore, the predicted battery consumption energy may be allocated as a first value of a time window the same as the input data to extract the predicted battery consumption energy information, i.e., data output from the battery usage prediction model. The predicted battery consumption energy may be extracted by moving the predicted battery consumption energy at the same time shift interval as the input data.

The vehicle state information is measured and obtained at the same time shift interval, the time-series information of speeds and accelerations and the vehicle state information are formed as the input information, and the battery consumption energy is predicted at the same time shift interval. This is applied to the input/output structure of the LSTM-DNN mixture model, i.e., the battery usage prediction model, and machine learning is performed.

The present disclosure is directed to finally determine the destination DTE. That is, present disclosure is directed to predict and determine the remaining DTE when the vehicle has finally arrived at the destination. The predicted remaining DTE is displayed on the display device of the vehicle, such as the cluster, to be notified to the driver.

Hereinafter, a method of determining a DTE using equations will be described.

According to an exemplary embodiment of the present disclosure, as described above, the destination DTE is determined to be a value obtained by subtracting the DTE reduced (or consumed) up to the present and the DTE to be reduced from the current position to the destination from the initial SOC-based maximum DTE.

This will be expressed by Equation 1 as follows:

$$d_{Dte\_Prd} = SOC_{Ini} \times d_{Max} - (\Delta SOC_{Cur} \times E_{Max}) \times (d_{Drv}/E_{Accum}) - (\Delta SOC_{Prd} \times E_{Max}) \times (d_{Res}/E_{Prd}) \quad (1)$$

Furthermore, $\Delta SOC_{Cur}$ and $\Delta SOC_{Prd}$ in Equation 1 may be expressed by Equations 2 and 3.

$$\Delta SOC_{Cur} = SOC_{Ini} - SOC_{Cur} \quad (2)$$

$$\Delta SOC_{Prd} = SOC_{Cur} - SOC_{Fin\_Prd} \quad (3)$$

Furthermore, $SOC_{Fin\_Prd}$ in Equation 3 may be defined by Equation 4.

$$SOC_{Fin\_Prd} = (E_{Prd}/E_{Max}) \quad (4)$$

$d_{Dte\_Prd}$ in Equations 1 to 4 indicates the destination DTE to be finally obtained (i.e., the predicted DTE value at the arrival of the destination from the current position), $SOC_{Ini}$ indicates the initial battery SOC (or residual capacity) after the charging of the battery, and $SOC_{Cur}$ indicates the current battery SOC, and $SOC_{Fin\_Prd}$ indicates the finally-predicted battery SOC at the destination.

Furthermore, $d_{Max}$ indicates the maximum DTE at the time of full charging (100% charging) of the battery of the vehicle, $d_{Drv}$ indicates the distance which the vehicle has traveled up to the present, and $d_{Res}$ indicates the remaining travel distance from the current position to the destination.

Furthermore, $E_{Accum}$ indicates the cumulatively-consumed battery energy which has accumulated up to the present, and $E_{Max}$ indicates the maximum available battery energy at the time of full charging. $E_{Prd}$ is an output of the battery usage prediction model as described above. $E_{Prd}$ is a value determined by the battery usage prediction model, and indicates the battery consumption energy predicted to be used from the current position to the destination, i.e., the predicted battery consumption energy to the destination.

$\Delta SOC_{Cur}$ indicates the battery SOC reduced up to the present after the charging of the battery, and as illustrated in Equation 2, is a value obtained by subtracting the current battery SOC ($SOC_{Cur}$) from the initial battery SOC ($SOC_{Ini}$) after the charging of the battery.

Furthermore, $\Delta SOC_{Prd}$ indicates the battery SOC value predicted to be reduced from the current position to the destination, and as illustrated in Equation 3, is a value obtained by subtracting the finally-predicted battery SOC at the destination ($SOC_{Fin\_Prd}$) from the current battery SOC ($SOC_{Cur}$).

The finally-predicted battery SOC at the destination ($SOC_{Fin\_Prd}$) is defined as a value obtained by dividing the predicted battery consumption energy to the destination ($E_{Prd}$), i.e., a value output from the battery usage prediction model, with the maximum available battery energy ($E_{Max}$) at the time of full charging.

In Equation 1, "$SOC_{Ini} \times d_{Max}$" indicates the initial SOC-based maximum DTE. As may be seen from the equation, the initial SOC-based maximum DTE may be determined as a value obtained by multiplying the initial battery SOC ($SOC_{Ini}$) after the charging of the battery and the maximum DTE ($d_{Max}$) at the time of full charging of the battery of the vehicle.

Furthermore, in Equation 1, "$(\Delta SOC_{Cur} \times E_{Max}) \times (d_{Drv}/E_{Accum})$" indicates the DTE reduced up to the present as the vehicle travels after the charging of the battery. "$(\Delta SOC_{Cur} \times E_{Max}) \times (d_{Drv}/E_{Accum})$" may be determined as a value obtained by multiplying the SOC-based battery consumption energy used up to the present after the charging of the battery and the fuel efficiency, i.e., the energy efficiency up to the present.

In Equation 1, "$\Delta SOC_{Cur} \times E_{Max}$" indicates the SOC-based battery consumption energy used up to the present after the charging of the battery. As may be seen from the equation, "$\Delta SOC_{Cur} \times E_{Max}$" may be determined as a value obtained by multiplying the battery SOC reduced up to the present ($\Delta SOC_{Cur} = SOC_{Ini} - SOC_{Cur}$; see Equation 2) after the charging of the battery and the maximum available battery energy ($E_{Max}$) at the time of full charging.

In Equation 1, "$d_{Drv}/E_{Accum}$" indicates the fuel efficiency, i.e., the energy efficiency, up to the present. As may be seen from the equation, "$d_{Drv}/E_{Accum}$" may be determined as a value obtained by dividing the distance that the vehicle has traveled up to the present with the cumulatively-consumed battery energy which has accumulated up t Equation 1, o the present.

Furthermore, in "$(\Delta SOC_{Prd} \times E_{Max}) \times (d_{Res}/E_{Prd})$" indicates the DTE to be reduced from the current position to the destination. "$(\Delta SOC_{Prd} \times E_{Max}) \times (d_{Res}/E_{Prd})$" may be determined using the battery consumption energy predicted by the battery usage prediction model, i.e., the predicted battery consumption energy ($E_{Prd}$).

In Equation 1, "$(\Delta SOC_{Prd} \times E_{Max}) \times (d_{Res}/E_{Prd})$", i.e., the DTE to be reduced from the current position to the destination, may be determined to be a value obtained by multiplying the SOC-based predicted consumption energy to be used from the current position to the destination and the predicted fuel efficiency from the current position to the destination.

In Equation 1, "$\Delta SOC_{Prd} \times E_{Max}$" is the SOC-based predicted consumption energy to be used from the current position to the destination. As may be seen from the equation, "$\Delta SOC_{Prd} \times E_{Max}$" may be determined as a value obtained by multiplying the battery SOC value predicted to be reduced ($\Delta SOC_{Prd}$) from the current position to the destination and the maximum available battery energy ($E_{Max}$) at the time of full charging.

Here, the battery SOC value predicted to be reduced ($\Delta SOC_{Prd}$) is a value obtained by subtracting the finally-predicted battery SOC at the destination ($SOC_{Fin\_Prd}$) from the current battery SOC ($SOC_{Cur}$) (see Equation 3), whereas the finally-predicted battery SOC at the destination ($SOC_{Fin\_Prd}$) is a value obtained by dividing the predicted battery consumption energy ($E_{Prd}$), i.e., the predicted battery usage value, determined by the battery usage prediction model, with the maximum available battery energy ($E_{Max}$) at the time of full charging (see Equation 4).

Furthermore, "$d_{Res}/E_{Prd}$" indicates the predicted fuel efficiency, i.e., the predicted energy efficiency value, from the current position to the destination. "$d_{Res}/E_{Prd}$" may be determined to be a value obtained by dividing the remaining travel distance ($d_{Res}$) from the current position to the destination with the predicted battery consumption energy ($E_{Prd}$) determined by the battery usage prediction model.

As a result, the destination DTE ($d_{Dte\_Prd}$) to be finally obtained may be determined to be a value obtained by subtracting the DTE "$(\Delta SOC_{Cur} \times E_{Max}) \times (d_{Drv}/E_{Accum})$" reduced up to the present during the traveling of the vehicle and the DTE to be reduced from the current position to the destination "$(\Delta SOC_{Prd} \times E_{Max}) \times (d_{Res}/E_{Prd})$" from the initial SOC-based maximum DTE "$SOC_{Ini} \times d_{Max}$".

As described above, the present disclosure is directed to design, construct, and use the input/output structure, in which the vehicle external environment information and the vehicle state information are inputs and the predicted battery consumption energy is output, using big data to generate a learning model able to effectively predict the battery consumption energy.

Furthermore, the information of speeds and accelerations, i.e., the vehicle external environment information, is formed into a predetermined time window using the big data and is divided at a predetermined time shift interval to include time-series information.

Furthermore, the vehicle state information measured at the same big data set and the predicted battery consumption energy are divided at a predetermined time shift interval, forming the same number of data sets as that of time-series information.

Furthermore, for speeds and accelerations of the vehicle external environment information to include a history of changes over time, feature information is output using a first neural network (e.g., an LSTM) processing the features of the time-series information. An input structure of a second neural network (e.g., a DNN) is constructed using the output feature information and the vehicle state information. The predicted battery consumption energy is disposed at the output. In the present manner, neural networks are trained using the data sets of the vehicle state information and the predicted battery consumption energy (see FIG. 4).

As a result, according to an exemplary embodiment of the present disclosure as described above, the battery usage (or battery consumption energy) to be consumed from the current position to the destination is directly predicted using the forward driving situation information (or future driving situation information) from the current position to the destination and the machine learning-based battery usage (or battery consumption energy) prediction model, and thereby, the DTE to be reduced to the destination is updated and reflected. Accordingly, the present disclosure may provide more accurate prediction compared to the related art in which energy to be consumed in the future is approximately determined using the fuel efficiency (or energy efficiency) information of the past.

Furthermore, the battery consumption energy to be consumed from the current position to the destination is directly predicted according to changes in the information of the route to the destination, i.e., navigation information updated in real time, and the real-time transportation situation information. Consequently, the final battery SOC at the destination and the DTE to be reduced to the destination may be predicted.

Accordingly, it is possible to more reasonably provide information regarding the DTE by real-time updating of the route from the current position to the destination and changes in the real-time transportation situation. Furthermore, the reasonably-determined remaining DTE may substantially help the driver make a more efficient charging plan.

Furthermore, the present disclosure may contribute to relieving the anxiety of drivers caused by an insufficient number of charging stations for electric vehicles and relatively long times for charging electric vehicles. Accordingly, the reliability of electric vehicle manufacturers may be improved, the repurchase rate of electric vehicles may be increased, and the marketability of electric vehicles may be improved.

Furthermore, the term related to a control device such as "controller", "control apparatus", "control unit", "control device", "control module", or "server", etc refers to a hardware device including a memory and a processor configured to execute one or more steps interpreted as an algorithm structure. The memory stores algorithm steps, and the processor executes the algorithm steps to perform one or more processes of a method in accordance with various exemplary embodiments of the present disclosure. The control device according to exemplary embodiments of the present disclosure may be implemented through a nonvolatile memory configured to store algorithms for controlling operation of various components of a vehicle or data about software commands for executing the algorithms, and a processor configured to perform operation to be described above using the data stored in the memory. The memory and the processor may be individual chips. Alternatively, the memory and the processor may be integrated in a single chip. The processor may be implemented as one or more processors. The processor may include various logic circuits and operation circuits, may process data according to a program provided from the memory, and may generate a control signal according to the processing result.

The control device may be at least one microprocessor operated by a predetermined program which may include a series of commands for carrying out the method included in the aforementioned various exemplary embodiments of the present disclosure.

The aforementioned invention can also be embodied as computer readable codes on a computer readable recording medium. The computer readable recording medium is any data storage device that can store data which may be thereafter read by a computer system and store and execute program instructions which may be thereafter read by a computer system. Examples of the computer readable recording medium include Hard Disk Drive (HDD), solid state disk (SSD), silicon disk drive (SDD), read-only memory (ROM), random-access memory (RAM), CD-ROMs, magnetic tapes, floppy discs, optical data storage devices, etc and implementation as carrier waves (e.g., transmission over the Internet). Examples of the program instruction include machine language code such as those generated by a compiler, as well as high-level language code which may be executed by a computer using an interpreter or the like.

In various exemplary embodiments of the present disclosure, each operation described above may be performed by a control device, and the control device may be configured by a plurality of control devices, or an integrated single control device.

In various exemplary embodiments of the present disclosure, the control device may be implemented in a form of hardware or software, or may be implemented in a combination of hardware and software.

Furthermore, the terms such as "unit", "module", etc. included in the specification mean units for processing at least one function or operation, which may be implemented by hardware, software, or a combination thereof.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described in order to explain certain principles of the invention and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. A method of determining a distance to empty (DTE) of a vehicle, the method comprising:
    in a state in which a travel route to a destination is set, transmitting real-time transportation situation information from a current position of the vehicle to the destination to the vehicle by a vehicle external system;
    receiving the transmitted transportation situation information and obtaining vehicle forward driving situation information to the destination, on which a real-time transportation situation is reflected, by a navigation terminal or a controller provided in the vehicle;
    predicting and determining, by the controller, predicted battery consumption energy consumed for traveling from the current position to the destination using a battery usage prediction model to which the obtained vehicle forward driving situation information and current vehicle state information obtained from the vehicle are input; and
    determining, by the controller, a DTE at the destination as a predicted value at the current position using the determined predicted battery consumption energy to the destination,
    wherein the current vehicle state information includes a residual battery capacity.

2. The method of claim 1, wherein the current vehicle state information further includes an electric load except for energy consumed for traveling of the vehicle, and an ambient temperature detected by a sensor.

3. The method of claim 1,
    wherein the real-time transportation situation information to the destination includes road link-specific distances and average driving times of the vehicle on a travel route from the current position to the destination of the set travel route, and
    wherein the vehicle forward driving situation information to the destination includes a speed and an acceleration of the vehicle on the travel route to the destination, determined from the road link-specific distances and the average driving times.

4. The method of claim 1,
    wherein the vehicle forward driving situation information to the destination includes a speed and an acceleration of the vehicle on a travel route from the current position to the destination, and
    wherein the navigation terminal or the controller of the vehicle is configured to obtain the speed and the acceleration of the vehicle on the travel route from the current position to the destination as time-series information and to provide the speed and the acceleration of the vehicle as inputs to the battery usage prediction model.

5. The method of claim 4, wherein the speed and the acceleration are combined as values of a same time window, and the current vehicle state information obtained at the same time as the speed and the acceleration is processed by being allocated to the same time window as the speed and the acceleration.

6. The method of claim 5, wherein the current vehicle state information further includes an electric load except for energy consumed for traveling of the vehicle, and an ambient temperature detected by a sensor.

7. The method of claim 5, wherein the battery usage prediction model is a machine learning-based prediction model.

8. The method of claim 7, wherein the battery usage prediction model is configured to:
   extract feature information of the speed and the acceleration by processing time-series data of the speed and the acceleration using a first neural network; and
   output the predicted battery consumption energy by processing the extracted feature information and the current vehicle state information as inputs using a second neural network.

9. The method of claim 7, wherein the battery usage prediction model is configured to:
   extract feature information of the speed and the acceleration while moving and updating time-series data of the speed and the acceleration at a predetermined time shift using a long short-term memory of a first neural network; and
   output the predicted battery consumption energy by processing the extracted feature information and the current vehicle state information as inputs using a deep learning neural network as a second neural network.

10. A method of determining a distance to empty (DTE) of a vehicle, the method comprising:
    in a state in which a travel route to a destination is set, transmitting real-time transportation situation information from a current position of the vehicle to the destination to the vehicle by a vehicle external system;
    receiving the transmitted transportation situation information and obtaining vehicle forward driving situation information to the destination, on which a real-time transportation situation is reflected, by a navigation terminal or a controller provided in the vehicle;
    predicting and determining, by the controller, predicted battery consumption energy consumed for traveling from the current position to the destination using a battery usage prediction model to which the obtained vehicle forward driving situation information and current vehicle state information obtained from the vehicle are input; and
    determining, by the controller, a DTE at the destination as a predicted value at the current position using the determined predicted battery consumption energy to the destination,
    wherein the determination of the DTE at the destination includes:
        determining a SOC-based maximum DTE from an initial state of charge (SOC) value of a battery of the vehicle after charging of the battery and a maximum DTE at full charging of the battery;
        determining a DTE reduced up to the present from SOC-based battery consumption energy used up to the present after the charging of the battery and energy efficiency information up to present;
        determining a DTE to be reduced from the current position to the destination using the predicted battery consumption energy to the destination; and
        determining the DTE at the destination to be a value obtained by subtracting the DTE reduced up to the present and the DET to be reduced from the current position to the destination from the determined initial SOC-based maximum DTE.

11. The method of claim 10, wherein, in the determination of the DTE to be reduced from the current position to the destination,
    the DTE to be reduced from the current position to the destination is determined to be a value obtained by multiplying SOC-based predicted consumption energy to be used from the current position to the destination and a predicted energy efficiency value to the destination,
    the SOC-based predicted consumption energy to be used from the current position to the destination is determined to be a value obtained by multiplying a battery SOC value predicted to be reduced from the current position to the destination and maximum available battery energy at the full charging of the battery, and
    the battery SOC value predicted to be reduced from the current position to the destination is obtained using the predicted battery consumption energy determined by the battery usage prediction model.

12. The method of claim 11,
    wherein the battery SOC value predicted to be reduced from the current position to the destination is a value obtained by subtracting a finally-predicted battery SOC at the destination from a current battery SOC, and
    wherein the finally-predicted battery SOC at the destination is determined to be a value obtained by dividing the predicted battery consumption energy determined by the battery usage prediction model with the maximum available battery energy at the full charging of the battery.

13. The method of claim 11, wherein the predicted energy efficiency value to the destination is determined to be a value obtained by dividing a remaining travel distance from the current position to the destination with the predicted battery consumption energy determined by the battery usage prediction model.

14. The method of claim 10, wherein, in the determination of the DTE reduced up to the present,
    the DTE reduced up to the present is determined to be a value obtained by multiplying the SOC-based battery consumption energy used up to the present after the charging of the battery and an energy efficiency up to the present, and
    the SOC-based battery consumption energy used up to the present is determined to be a value obtained by multiplying a battery SOC reduced up to the present after the charging of the battery and the maximum available battery energy at the full charging of the battery.

15. A system for determining a distance to empty (DTE) of a vehicle, the system comprising:
    a vehicle external system providing real-time transportation situation information from a current position of the vehicle to a destination on a travel route to the destination;
    a navigation terminal provided in the vehicle to transmit destination information received from a driver to the vehicle external system and receive information regarding the travel route to the destination and a map and the real-time transportation situation information from the vehicle external system; and
    a controller configured for predicting and determining predicted battery consumption energy consumed for traveling from the current position to the destination using a battery usage prediction model to which vehicle forward driving situation information on which a real-time transportation situation is reflected and current vehicle state information obtained from the vehicle are input, and determining a DTE at the destination as a predicted value at the current position using the determined predicted battery consumption energy to the destination, wherein the vehicle forward driving situation information to the destination, on which the real-time transportation situation is reflected, is obtained from the information regarding the travel route to the destination and the map and the received transportation situation information by the navigation terminal provided in the vehicle or the controller, wherein the current vehicle state information includes a residual battery capacity.

16. The system of claim 15, wherein the current vehicle state information further includes an electric load except for energy consumed for traveling of the vehicle, and an ambient temperature detected by a sensor.

17. The system of claim 15, wherein the real-time transportation situation information to the destination includes road link-specific distances and average driving times of the vehicle on a travel route from the current position to the destination of a set travel route, and wherein the vehicle forward driving situation information to the destination includes a speed and an acceleration of the vehicle on the travel route to the destination, determined from the road link-specific distances and the average driving times.

18. The system of claim 17, wherein the speed and the acceleration are combined as values of a same time window, and the current vehicle state information obtained at the same time as the speed and the acceleration is processed by being allocated to the same time window as the speed and the acceleration.

19. The system of claim 18, wherein the battery usage prediction model is a machine learning-based prediction model.

20. The system of claim 19, wherein the battery usage prediction model is configured to:

extract feature information of the speed and the acceleration by processing time-series data of the speed and the acceleration using a first neural network; and output the predicted battery consumption energy by processing the extracted feature information and the current vehicle state information as inputs using a second neural network.

* * * * *